(12) United States Patent  
Kawakubo et al.

(10) Patent No.: US 7,135,940 B2  
(45) Date of Patent: Nov. 14, 2006

(54) TUNABLE FILTER AND PORTABLE TELEPHONE

(75) Inventors: Takashi Kawakubo, Kanagawa-ken (JP); Ryoichi Ohara, Kanagawa-ken (JP); Kazuhide Abe, Kanagawa-ken (JP); Hiroshi Yoshida, Kanagawa-ken (JP); Hiroshi Tsurumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 11/039,872

(22) Filed: Jan. 24, 2005

(65) Prior Publication Data

US 2005/0212612 A1    Sep. 29, 2005

(30) Foreign Application Priority Data

Jan. 30, 2004    (JP)    ............... 2004-023012

(51) Int. Cl.
*H03H 21/00* (2006.01)
*H03H 9/54* (2006.01)
*H03H 9/64* (2006.01)

(52) U.S. Cl. ............. 333/17.1; 333/189; 333/193

(58) Field of Classification Search ........... 333/17.1, 333/187, 189, 193
See application file for complete search history.

(56) References Cited

U.S. PATENT DOCUMENTS

| 5,493,715 | A  | * | 2/1996  | Humphreys et al. | 455/264  |
|-----------|----|---|---------|------------------|----------|
| 5,933,062 | A  | * | 8/1999  | Kommrusch        | 333/193  |
| 6,307,442 | B1 | * | 10/2001 | Meyer et al.     | 333/17.1 |
| 6,653,913 | B1 | * | 11/2003 | Klee et al.      | 333/188  |
| 6,759,916 | B1 | * | 7/2004  | Ishizaki et al.  | 333/17.1 |
| 6,791,430 | B1 | * | 9/2004  | Borzenets et al. | 333/17.1 |
| 6,882,246 | B1 | * | 4/2005  | Marquardt et al. | 333/174  |
| 7,049,902 | B1 | * | 5/2006  | Myong et al.     | 333/17.1 |
| 2003/0067368 | A1 |   | 4/2003  | Ohara et al.     | 333/188  |
| 2004/0012463 | A1 |   | 1/2004  | Kawakubo et al.  | 333/187  |
| 2005/0184627 | A1 | * | 8/2005  | Sano et al.      | 310/363  |
| 2005/0194867 | A1 | * | 9/2005  | Kawakubo et al.  | 310/348  |
| 2005/0242687 | A1 | * | 11/2005 | Kawakubo et al.  | 310/324  |
| 2005/0280476 | A1 | * | 12/2005 | Abe et al.       | 331/17   |
| 2006/0067840 | A1 | * | 3/2006  | Kawakubo et al.  | 417/413.2|

FOREIGN PATENT DOCUMENTS

JP    2003-22074    1/2003
JP    2003-179518    6/2003

OTHER PUBLICATIONS

U.S. Appl. No. 11/043,257, filed Jan. 27, 2005, Sano et al.

(Continued)

*Primary Examiner*—Barbara Summons
(74) *Attorney, Agent, or Firm*—Oblon, Spivak, McClelland, Maier & Neustadt, P.C.

(57) ABSTRACT

A tunable filter has a plurality of variable capacitors and a plurality of inductor elements, each being formed on a common substrate, a filter circuit formed by using at least a portion of the plurality of variable capacitors and a portion of the plurality of inductor elements, a monitor circuit formed by using at least a portion of the plurality of variable capacitors and a portion of the plurality of inductor elements, a detecting circuit which detects a prescribed circuit constant of the monitor circuit, a storage which stores information relating to a reference circuit constant of the monitor circuit, and a capacitance control circuit which controls capacitance of the variable capacitors in the monitor circuit and capacitance of the variable capacitors in the filter circuit, based on a result detected by the detecting circuit and information stored in the storage.

20 Claims, 15 Drawing Sheets

OTHER PUBLICATIONS

U.S. Appl. No. 11/054,404, filed Feb. 10, 2005, Kawakubo et al.
U.S. Appl. No. 11/115,107, filed Apr. 27, 2005, Kawakubo et al.
U.S. Appl. No. 11/151,343, filed Jun. 14, 2005, Abe et al.
U.S. Appl. No. 11/229,694, filed Sep. 20, 2005, Kawakubo et al.

* cited by examiner

FILTER CHARACTERISTICS

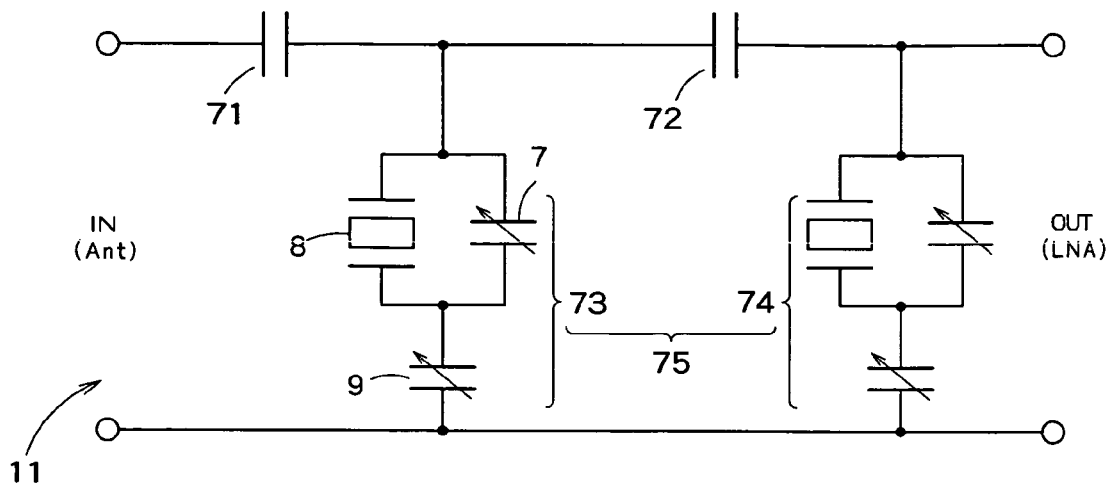
F I G. 10
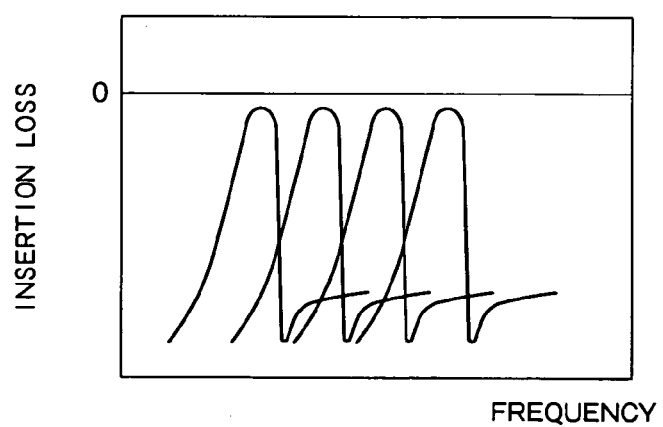
F I G. 11

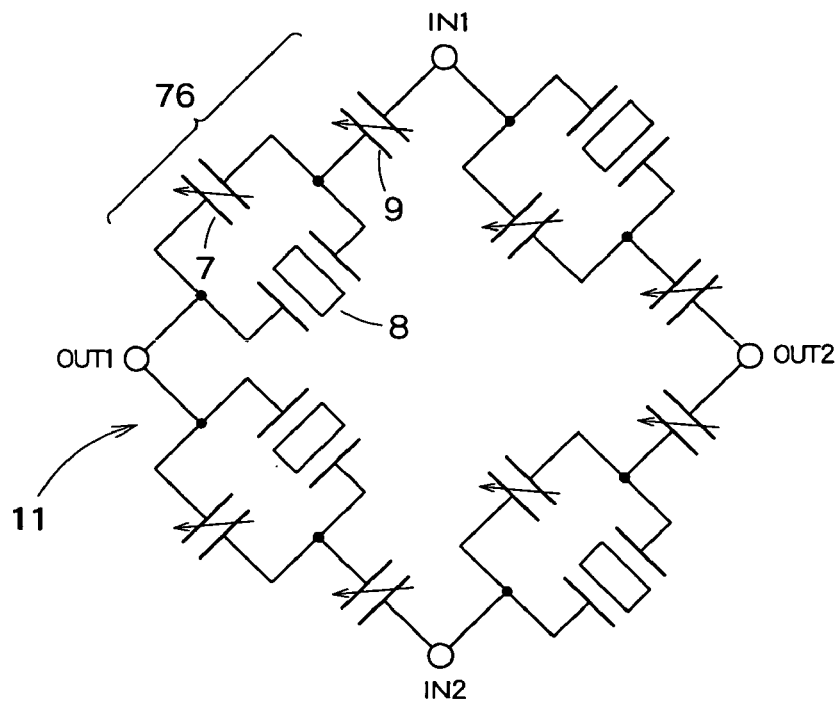
F I G. 12
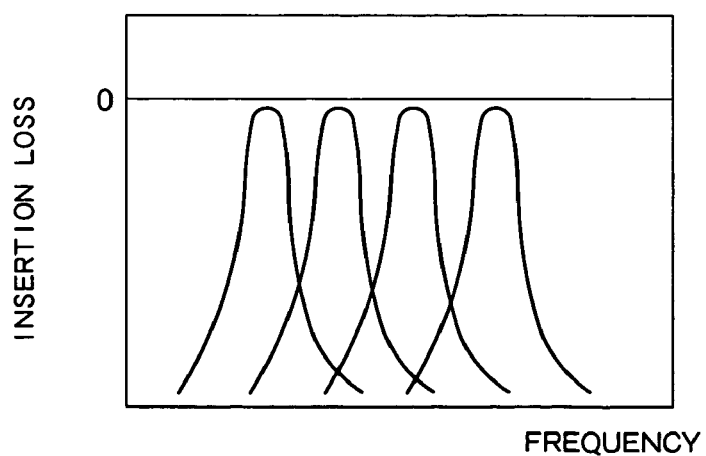
F I G. 13

F I G. 15A
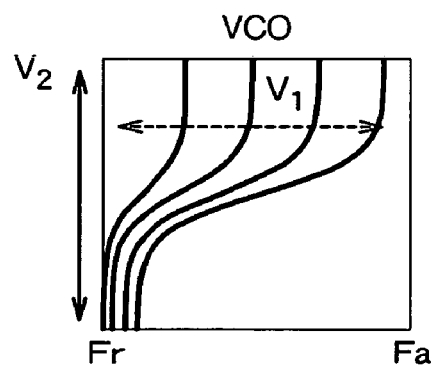
F I G. 15B
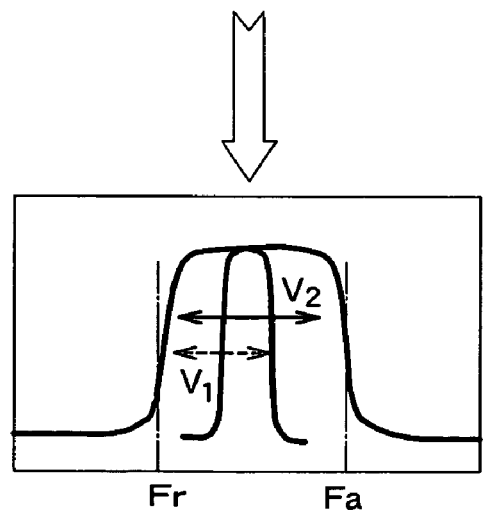
FILTER CHARACTERISTICS

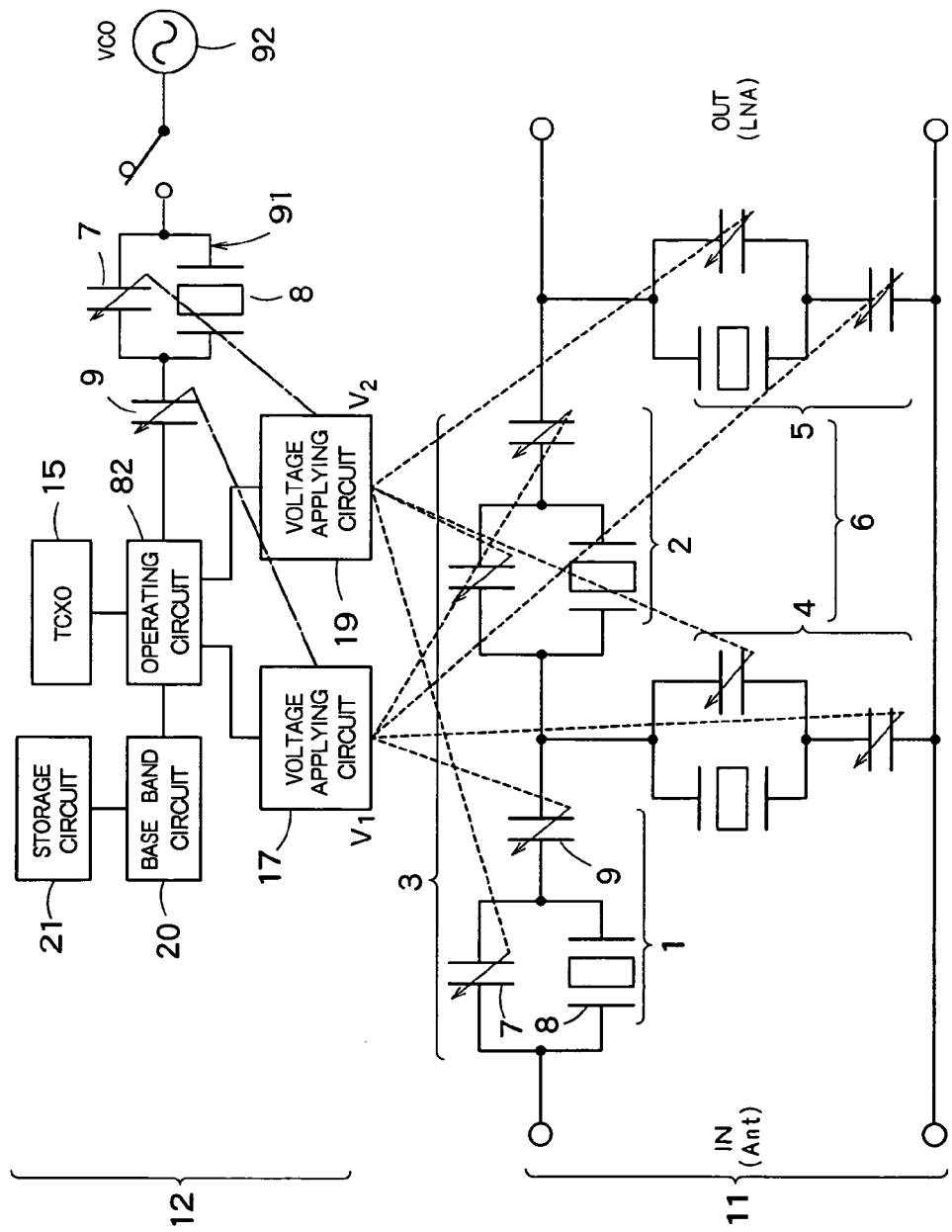
F I G. 16

UNIT CHARACTERISTICS

FILTER CHARACTERISTICS

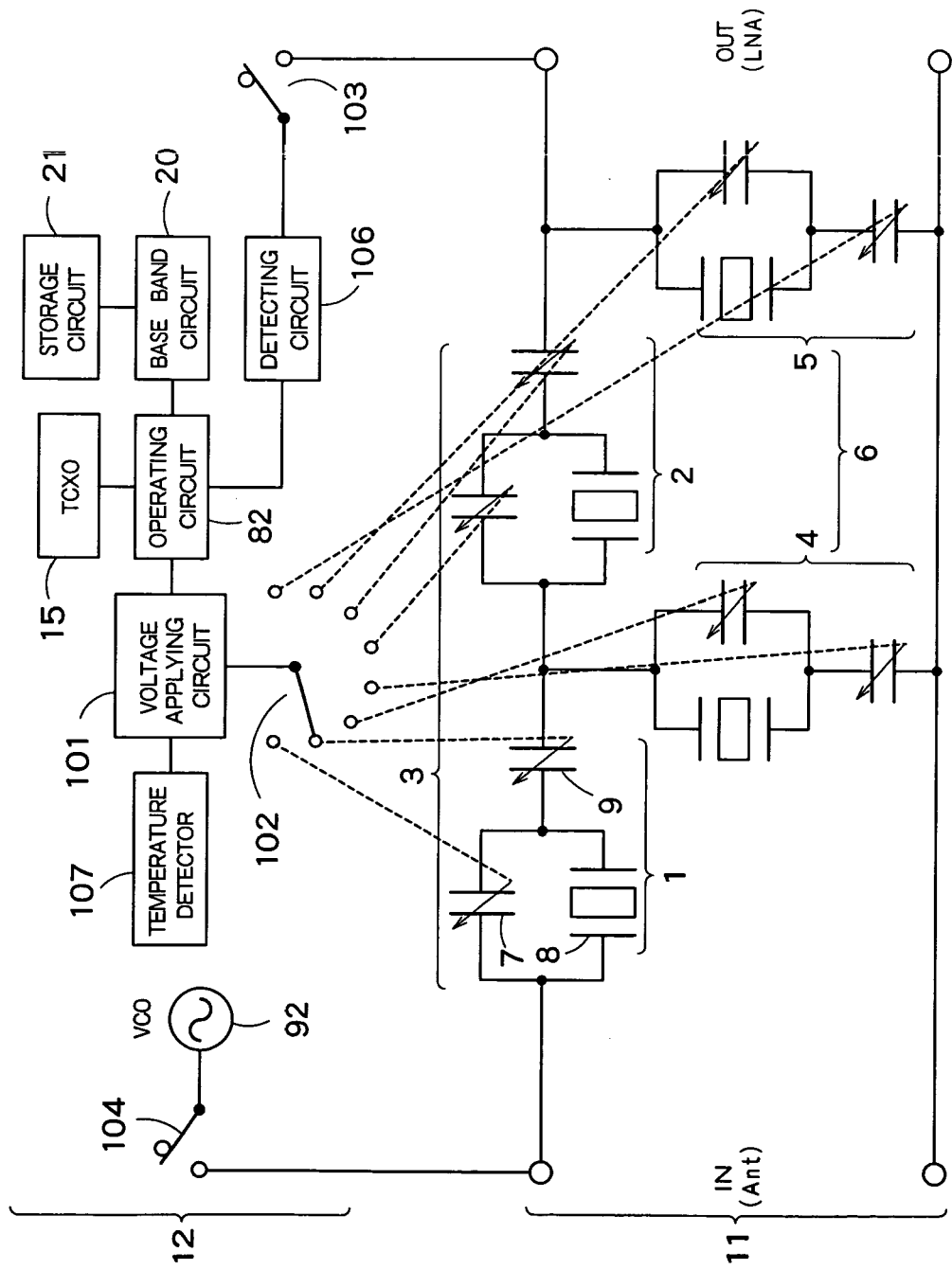
F I G. 18

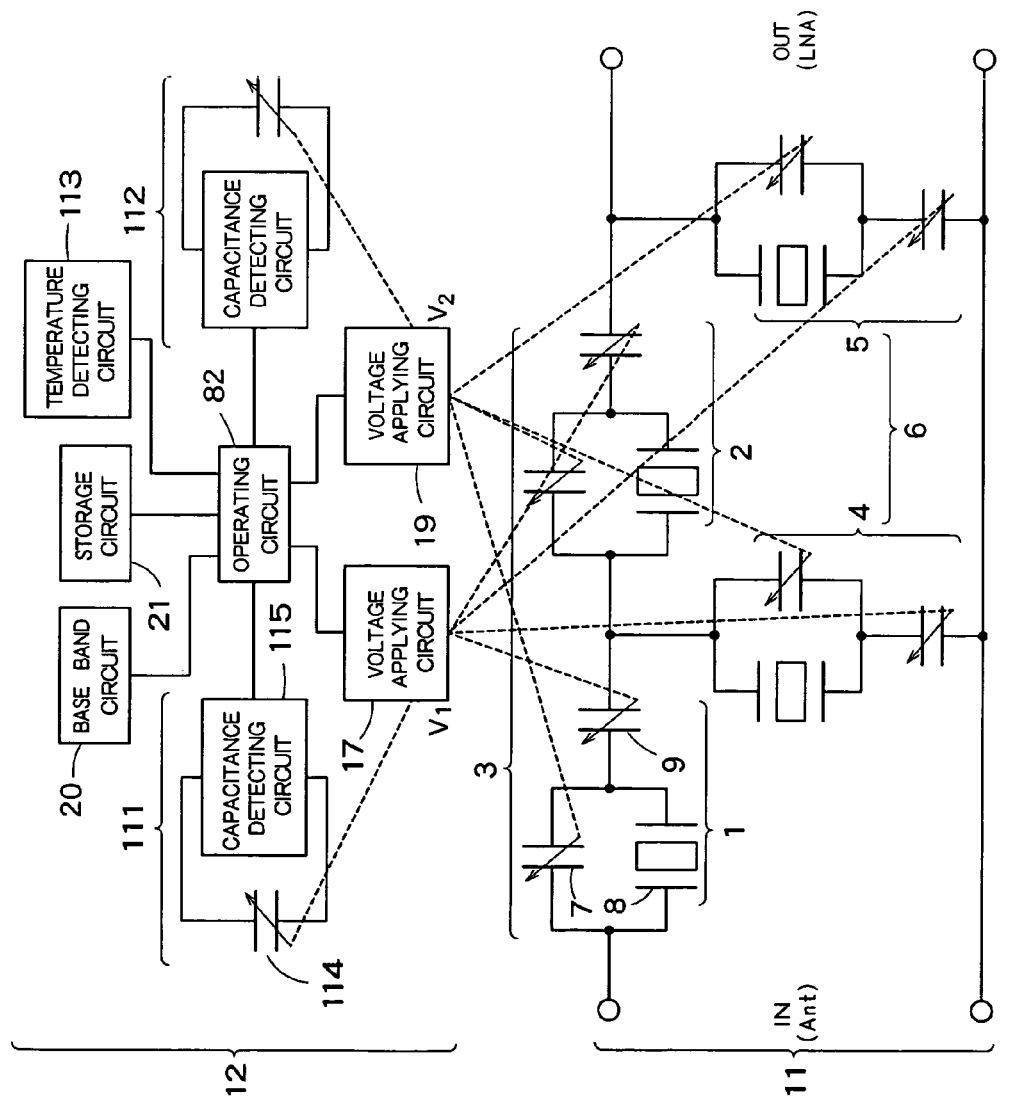
F I G. 19

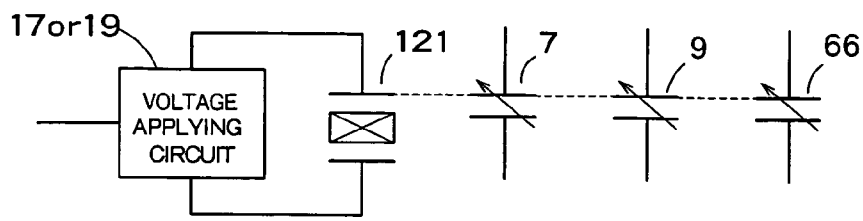
F I G. 21
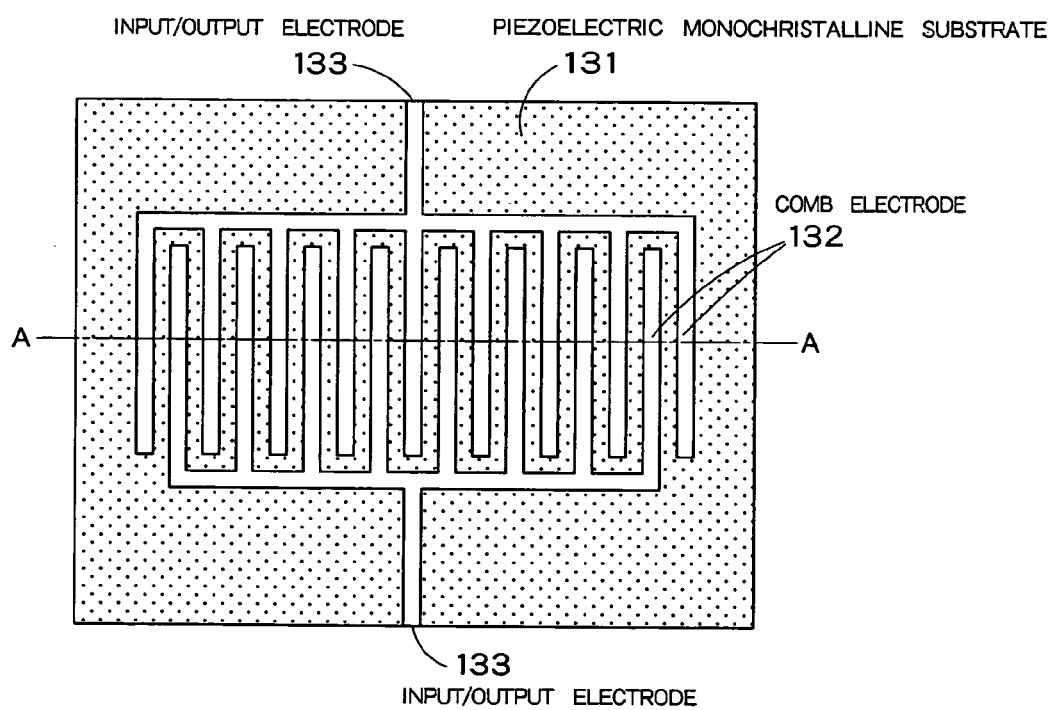
F I G. 22
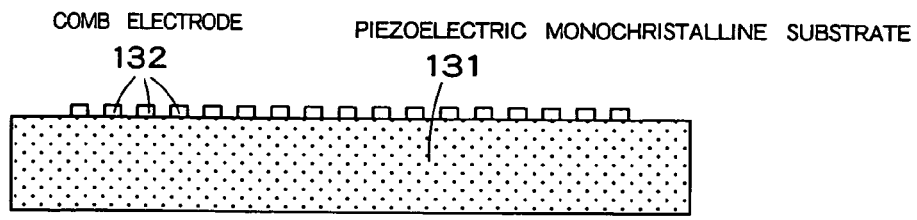
F I G. 23

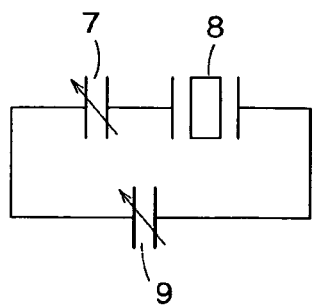
F I G. 24
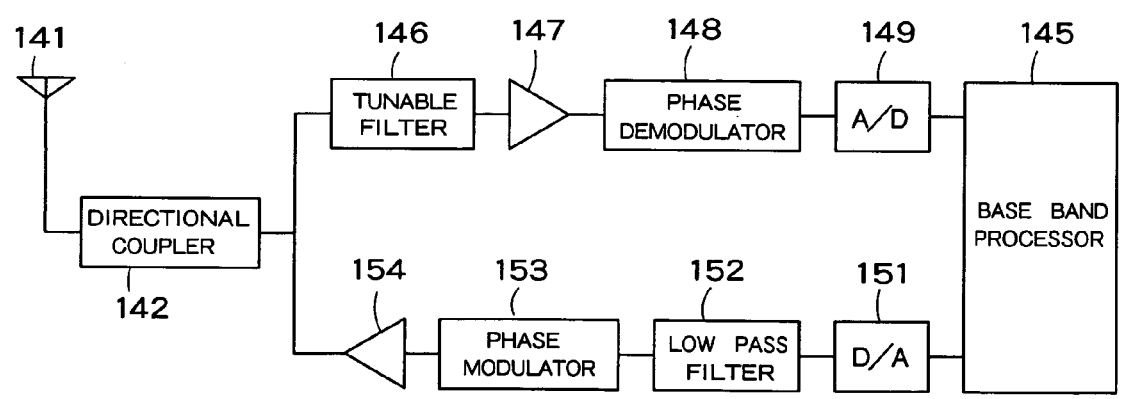
F I G. 25

TUNABLE FILTER AND PORTABLE TELEPHONE

CROSS REFERENCE TO RELATED APPLICATIONS

This application claims benefit of priority under 35USC§119 to Japanese Patent Application No. 2004-23012, filed on Jan. 30, 2004, the entire contents of which are incorporated by reference herein.

BACKGROUND OF THE INVENTION

1. Field of the Invention

The present invention relates to a tunable filter having a variable capacitor of which capacitance is variably controlled by a thin-film piezoelectric actuator and an inductor element.

2. Related Art

In the radio communication field, there is a strong demand for realizing a tunable filter that can continuously and freely change a pass band and a block band. Characteristics required for the tunable filter are, for example, a large band-change width, a continuous band change, small insertion loss and precipitous shielding characteristic as a filter (i.e., high Q), compactness and lightness, and high reliability and excellent reproducibility. However, filters having only remarkably limited performance can be achieved at present.

A filter is a circuit basically having a combination of an inductor element and a capacitor. A tunable filter can be realized when either inductance of the inductor element or capacitance of the capacitor can be changed.

Inductance of an inductor element is determined by a length and shape of a transmission path, and permeability in space. A variable inductor which changes permeability by placing and taking out a ferromagnetic core in the center of the coil using an inductor element having low Q is in practical use. However, an attempt to obtain large variable inductance is not known, using an inductor element of high Q used in a high-frequency band of a few hundred MHz or above for portable telephones or the like.

On the other hand, capacitance of a capacitor is determined by area and an interval of a pair of opposite electrodes, and permeability in space. A ferroelectric substance such as barium titanate and lead zirconate titanate has a characteristic that its permittivity changes by a few times at a maximum, when a direct current bias is applied to this ferroelectric substance. Therefore, a variable capacitor can be formed using these ferroelectric substances. However, a ferroelectric substance generally has large dielectric loss and has low Q.

A variable capacitor can be configured when a distance between electrodes is variable, and therefore, an electromagnetic driving mechanism such as a motor can be utilized. However, this has a slow response and has a large size. Therefore, the electromagnetic driving mechanism is not suitable for a mobile radio terminal such as a cellular phone.

A variable capacitor using an electrostatic driving type MEMS (Micro-Electro-Mechanical System) recently calls attention. For example, an experiment example of a tunable filter that has a troidal coil and many electrostatic driving type variable capacitors connected together is introduced (see 2003 IEEE Microwave Theory and Technique Symposium Digest p. 1781).

However, the electrostatic driving type variable capacitor has a phenomenon called pull-in in operation. While capacitance changes in the order of about two digits in on-off operations, capacitance disadvantageously changes continuously within a range of 1.5 times. Therefore, when the electrostatic driving type variable capacitor is applied to the tunable filter, it is difficult to realize the most demanded characteristic of continuously changing a band on a large scale, although a band can be digitally switched on a large scale.

SUMMARY OF THE INVENTION

The present invention provides a tunable filter which can change a pass band at wide frequency range, can continuously change the pass band, has small insertion loss, has precipitous shielding characteristic, can downsize, and has excellent reliability and reproducibility.

According to one embodiment of the present invention, a tunable filter, comprising:

a plurality of variable capacitors and a plurality of inductor elements, each being formed on a common substrate;

a filter circuit formed by using at least a portion of said plurality of variable capacitors and a portion of said plurality of inductor elements;

a monitor circuit formed by using at least a portion of said plurality of variable capacitors and a portion of said plurality of inductor elements;

a detecting circuit which detects a prescribed circuit constant of said monitor circuit;

a storage which stores information relating to a reference circuit constant of said monitor circuit; and a capacitance control circuit which controls capacitance of said variable capacitors in said monitor circuit and capacitance of said variable capacitors in said filter circuit, based on a result detected by said detecting circuit and information stored in said storage.

According to one embodiment of the present invention, a portable telephone, comprising:

an antenna which sends and receives a wireless signal modulated by phase;

a receiver which receives a reception signal received by said antenna; and a transmitter which sends a transmission signal sent by said antenna, wherein said receiver includes:

a high frequency amplifier which amplifies the reception signal modulated by phase; and a tunable filter which is provided at former stage or subsequent stage of said high frequency amplifier and extracts the reception signal in a prescribed frequency component, said tunable filter having:

a plurality of variable capacitors and a plurality of inductor elements, each being formed on the same substrate;

a filter circuit formed by using at least a portion of said plurality of variable capacitors and a portion of said plurality of inductor elements;

a monitor circuit formed by using at least a portion of said plurality of variable capacitors and a portion of said plurality of inductor elements;

a detecting circuit which detects a prescribed circuit constant of said monitor circuit;

a storage which stores information relating to a reference circuit constant of said monitor circuit; and a capacitance control circuit which controls capacitance of said variable capacitors in said monitor circuit and capacitance of said variable capacitors in said filter circuit, based on a result detected by said detecting circuit and information stored in said storage.

BRIEF DESCRIPTION OF THE DRAWINGS

FIG. 10 is a circuit diagram of the filter main body 11 according to the second embodiment.

FIG. 11 is a diagram showing passage characteristics of the tunable filter using the filter main body 11 shown in FIG. 10.

FIG. 12 is a circuit diagram of the filter main body 11 according to the third embodiment.

FIG. 13 is a diagram showing passage characteristics of the tunable filter using the filter main body 11 shown in FIG. 12.

FIGS. 15A and 15B are diagrams for explaining the principle of the operation of the tunable filter shown in FIG. 14.

FIG. 16 is an equivalent circuit diagram of a tunable filter according to the fifth embodiment of the present invention.

FIG. 18 is an equivalent circuit diagram of a tunable filter according to the sixth embodiment of the present invention.

FIG. 19 is an equivalent circuit diagram of a tunable filter according to the seventh embodiment of the present invention.

FIG. 21 is a diagram showing an example of a state that one actuator 121 is used to drive variable capacitor within plural resonators.

FIG. 22 is a top plan diagram showing one example of a surface acoustic wave element.

FIG. 23 is a cross-sectional diagram of the surface acoustic wave element shown in FIG. 22 cut along a line A—A.

FIG. 24 is a diagram showing an example of a resonator that is configured by a variable capacitor and a film bulk acoustic resonator that are connected in series, and a variable capacitor that is connected in parallel with them.

FIG. 25 is a block diagram showing one example of a schematic configuration of a portable telephone that incorporates the tunable filter according to the above embodiments.

DETAILED DESCRIPTION OF THE INVENTION

Hereafter, an embodiment of the present invention will be described more specifically with reference to the drawings.

(First Embodiment)

Figure 1:
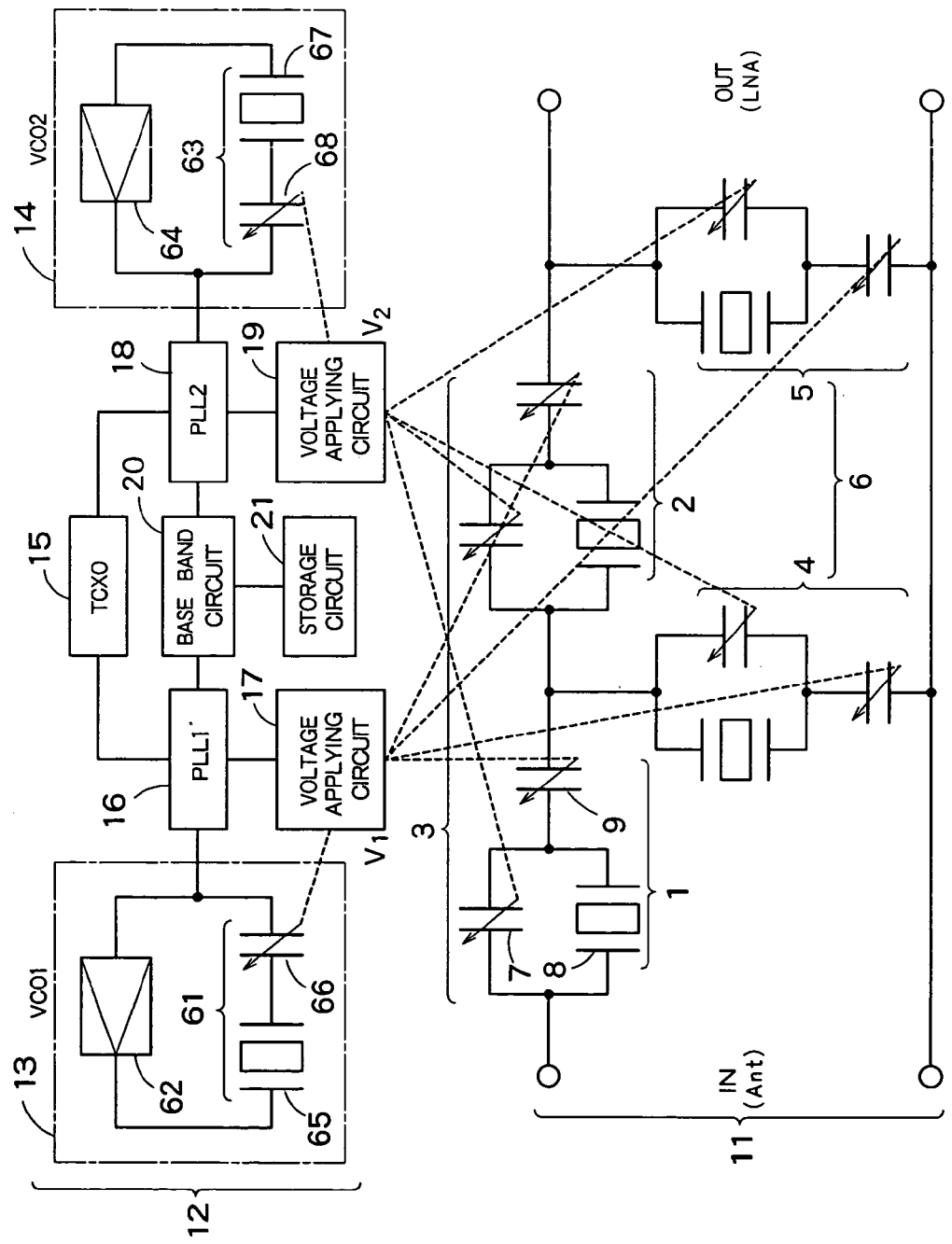
FIG. 1 is an equivalent circuit diagram of a tunable filter according to a first embodiment of the present invention.

FIG. 1 is an equivalent circuit diagram of a tunable filter according to a first embodiment of the present invention. The tunable filter shown in FIG. 1 includes a filter main body 11, and a control circuit 12 that controls the filter main body 11.

The filter main body 11 is a ladder filter including a series resonance unit 3 having two resonance units 1 and 2 connected in series, and parallel resonance units 4 and 5 that are connected to between one end of the resonance units 1 and 2, respectively and an input/output common terminal. Each of the resonance units 1, 2, 4, and 5 has a variable capacitor 7 and a thin-film piezoelectric resonator, i.e., a film bulk acoustic resonator (FBAR) 8 that are connected in parallel, and a variable capacitor 9 that is connected in series with them. An upper electrode of the film bulk acoustic resonator 8 within the series resonance unit 3 and an upper electrode of the film bulk acoustic resonator 8 within the parallel resonance unit 6 have mutually different thicknesses. Based on this, a resonance frequency of the series resonance unit 3 and a resonance frequency of the parallel resonance unit 6 are slightly different from each other. Configurations of the variable capacitors 7 and 9, and the film bulk acoustic resonator 8 are described later.

The control circuit 12 includes a first voltage controlled oscillator (VCO1) 13 that oscillates in a first oscillation frequency, a second voltage controlled oscillator (VCO2) 14 that oscillates in a second oscillation frequency, a temperature compensated crystal oscillator (TCXO) 15 that generates a reference frequency signal, a PLL (phase-locked loop) circuit (PLL1) 16 that controls the oscillation frequency of the first voltage controlled oscillator 13, a voltage applying circuit 17 that controls capacitance of a part of the variable capacitors within the tunable filter, a PLL circuit (PLL2) 18 that controls the oscillation frequency of the second voltage controlled oscillator 14, a voltage applying circuit 19 that controls capacitance of other part of the variable capacitors within the tunable filter, a base band circuit 20, and a storage circuit 21 that stores reference frequencies of the first and the second voltage controlled oscillators 13 and 14. The first voltage controlled oscillator 13 and the second voltage controlled oscillator 14 constitute a monitoring circuit.

Figure 2:
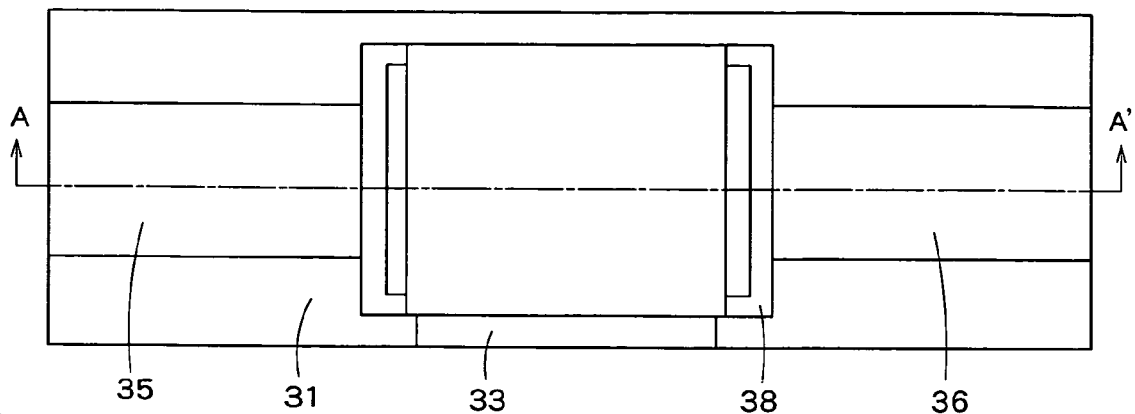
FIG. 2 is a top plan diagram of the variable capacitors 7 and 9 that are used in the tunable filter shown in FIG. 1.
Figure 3:
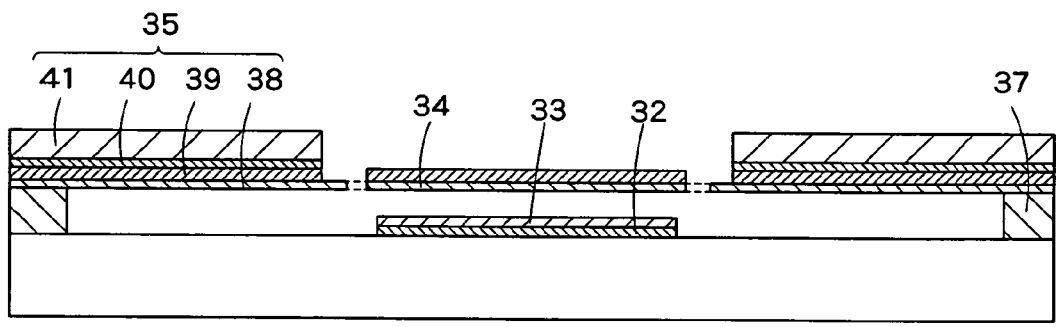
FIG. 3 is a cross-sectional diagram of the variable capacitors cut along a line A–A' in FIG. 2.

FIG. 2 is a top plan diagram of the variable capacitors 7 and 9 that are used in the tunable filter shown in FIG. 1. FIG. 3 is a cross-sectional diagram of the variable capacitors cut along a line A–A' in FIG. 2. As shown in these diagrams, each of the variable capacitors 7 and 9 have fixed electrode 32 formed on a silicon substrate 31, a dielectric film 33 formed on the upper surface of the fixed electrode 32, and a variable electrode 34 disposed opposed above the dielectric film 33.

Bimorph type thin-film piezoelectric actuators 35 and 36 are formed at the left and right sides of the variable electrode 34. Each of the thin-film piezoelectric actuators 35 and 36 has a first electrode 38 formed above the silicon substrate 31 via an anchor 37, a piezoelectric film 39 formed on the upper surface of the first electrode 38, a second electrode 40 formed on the piezoelectric film 39, and a support beam 41 formed on the upper surface of the second electrode 40.

When a voltage is applied to between the first electrode 38 and the second electrode 40, bimorph operation occurs to displace the actuators 35 and 36. Maximum capacitance is obtained when the variable electrode 34 and the dielectric film 33 are brought into contact with each other. Minimum capacitance is obtained when the variable electrode 34 is furthest from the dielectric film 33. The dielectric film 33 formed on the upper surface of the fixed electrode 32 prevents occurrence of short-circuit between the fixed electrode 32 and the variable electrode 34.

Figure 4:
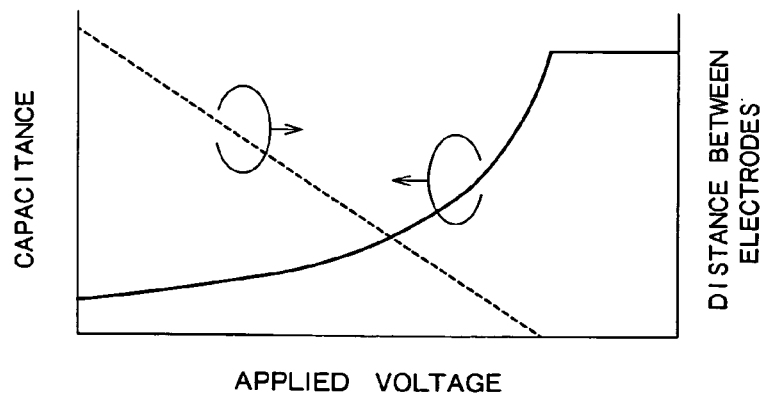
FIG. 4 is a diagram showing a relation between driving voltages applied to the thin-film piezoelectric actuators 35 and 36 and capacitances of the variable capacitors 7 and 9.

FIG. 4 is a diagram showing a relation between driving voltages applied to the thin-film piezoelectric actuators 35 and 36 and capacitances of the variable capacitors 7 and 9. A distance between electrodes changes in proportion to an application voltage. Capacitance changes in inverse proportion to a distance between electrodes. Capacitance can change continuously in the order of about two digits. When electrodes have a large film thickness to have a low direct-current resistance, Q becomes very large too.

The first electrode 38 and the second electrode 40 of the thin-film piezoelectric actuators 35 and 36, and the variable electrode 34 and the fixed electrode 32 of the variable capacitors 7 and 9 can have a thickness within a range of 10 nm to 1 μm, by taking a resistance into account, respectively. According to the present embodiment, these electrodes are assumed to have a thickness of 50 nm, respectively. The piezoelectric film 39 can have a thickness within a range of 10 nm to 1 μm, by taking displacement into account. According to the present embodiment, the piezoelectric film 39 is assumed to have a thickness of 500 nm. The dielectric film 33 is assumed to have a thickness of 50 nm, and equivalent area of the variable capacitors 7 and 9 is assumed to be 6400 μm.

Capacitances of the variable capacitors 7 and 9 are measured by changing control voltages Vtune applied to the thin-film piezoelectric actuators 35 and 36 within a range of 0 to 3 volts. As a result, minimum capacitance is 0.34 pF and maximum capacitance is 2.86 pF, which shows a large change of 8.4 times.

Figure 5:
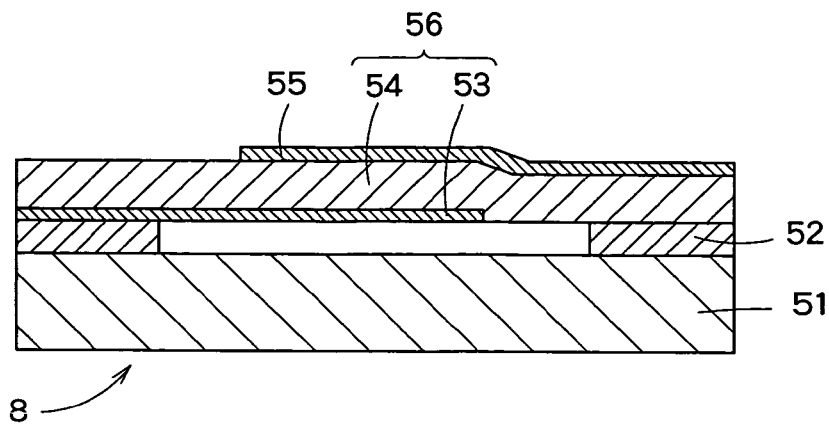
FIG. 5 is a cross-sectional configuration diagram of the film bulk acoustic resonator 8.

FIG. 5 is a cross-sectional configuration diagram of the film bulk acoustic resonator 8. The film bulk acoustic resonator 8 shown in FIG. 5 includes a lower electrode 53 formed on a silicon substrate 51 via an anchor 52, a piezoelectric unit 54 that covers the surrounding of the lower electrode 53, and an upper electrode 55 formed on the upper surface of the piezoelectric unit 54. An aluminum nitride film that grows in orientation to a direction of axis c is used for the piezoelectric unit 54. Aluminum is used for the upper electrode 55 and the lower electrode 53, respectively. A resonator 56 including the lower electrode 53, the piezoelectric unit 54, and the upper electrode 55 is fixed to the substrate via the anchor 52.

When an alternate current is applied to between the upper electrode 55 and the lower electrode 53, an alternate stress occurs due to a piezoelectric adverse effect, thereby exciting a resonance of an elastic wave in a thickness vertical mode. A film thickness of the piezoelectric unit 54 substantially corresponds to a half wave length of the resonance frequency.

Figure 6:
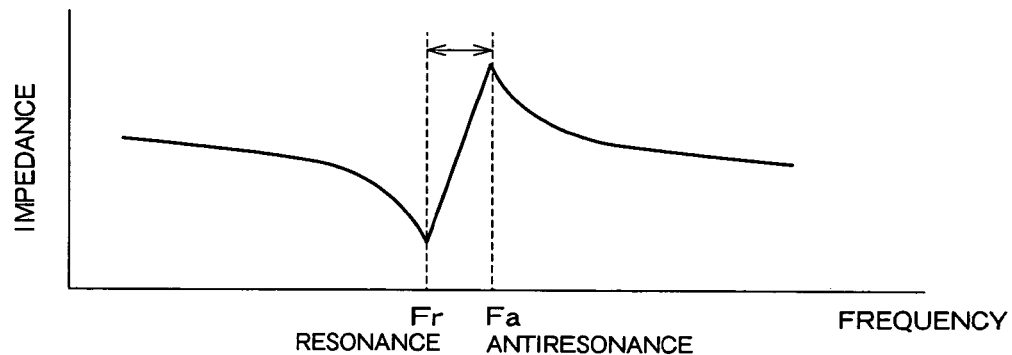
FIG. 6 is a diagram showing impedance characteristic of the film bulk acoustic resonator 8.
Figure 7:
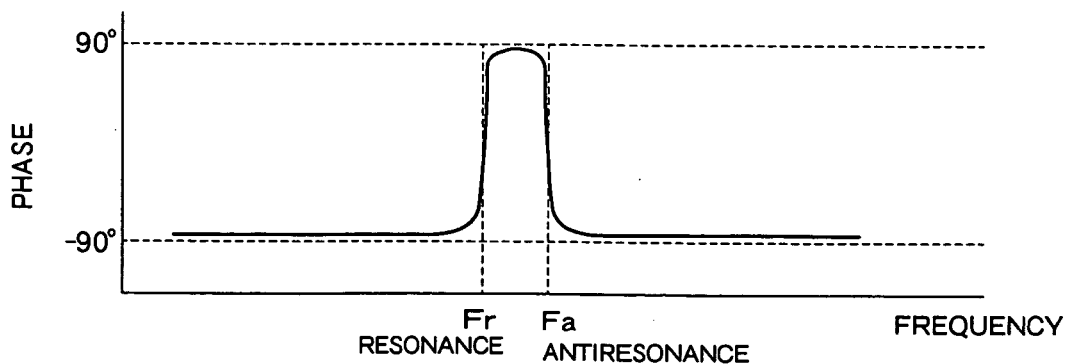
FIG. 7 is a diagram showing a phase characteristic of the film bulk acoustic resonator 8.

FIG. 6 is a diagram showing impedance characteristic of the film bulk acoustic resonator 8. FIG. 7 is a diagram showing a phase characteristic of the film bulk acoustic resonator 8. Impedance becomes minimum at a resonance point Fr, and impedance becomes maximum at an antiresonance point Fa. The inductor can have very high Q between Fr and Fa.

When an oriented thin film of aluminum nitride or zinc oxide is used for the piezoelectric unit 54, a distance between Fr and Fa can be taken by 5 to 6 percent cent. Therefore, a filter having a relatively wide band can be configured.

As is clear from a comparison between FIG. 3 and FIG. 5, the variable capacitors 7 and 9 and the film bulk acoustic resonator 8 that are driven with the thin-film piezoelectric actuators 35 and 36 have very similar configurations. Therefore, these units can be manufactured in a common manufacturing process. When they are hollow sealed, a larger advantage can be obtained. Particularly, when plural elements are prepared on the same substrate, a variance between the elements can be reduced, which contributes to improve performance of the filter.

According to the present embodiment, in order to obtain 2 GHz of resonance frequency, the piezoelectric unit 54 has a film thickness of 1100 nm, the lower electrode 53 has a film thickness of 100 nm, and the upper electrode 55 has a film thickness of 150 nm.

The first voltage controlled oscillator 13 shown in FIG. 1 has a tank circuit 61 and an amplifier 62 connected in parallel. The second voltage controlled oscillator 14 has a tank circuit 63 and an amplifier 64 that are connected in parallel. The tank circuit 61 has a film bulk acoustic resonance unit 65 and a variable capacitor 66 that are connected in parallel. The tank circuit 63 also has a film bulk acoustic resonance unit 67 and a variable capacitor 68 that are connected in series. The film bulk acoustic resonators 65 and 67 within the tank circuits 61 and 63 have configurations similar to those shown in FIG. 5. The variable capacitors 66 and 68 have configurations similar to those shown in FIG. 3.

The voltage applying circuit 17 controls capacitance of the variable capacitor 66 within the first voltage controlled oscillator 13, and controls capacitance of the variable capacitor 9 within the series resonance unit 3 and capacitance of the variable capacitor 9 within the parallel resonance unit 6.

The voltage applying circuit 19 controls capacitance of the variable capacitor 68 within the second voltage controlled oscillator 14, and controls capacitance of the variable capacitor 7 within the series resonance unit 3 and capacitance of the variable capacitor 7 within the parallel resonance unit 6.

Figure 8:
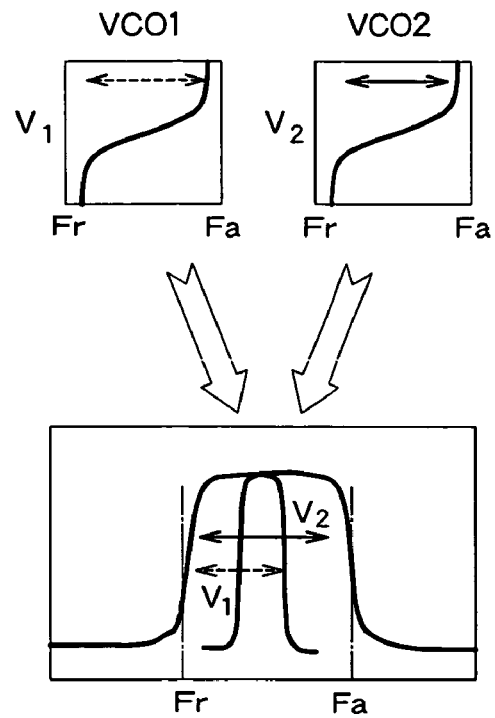
FIG. 8 is a diagram for explaining the principle of the operation of the tunable filter shown in FIG. 1.

FIG. 8 is a diagram for explaining the principle of the operation of the tunable filter shown in FIG. 1. The oscillation frequency of the first voltage controlled oscillator 13 is determined by a control voltage V1 that is output from the voltage applying circuit 17. The oscillation frequency of the second voltage controlled oscillator 14 is determined by a control voltage V2 that is output from the voltage applying circuit 19.

The storage circuit 21 stores information concerning the oscillation frequencies of the first voltage controlled oscillator 13 and the second voltage controlled oscillator 14 so that band passage characteristics that are optimum for selecting a channel individual to the communication system are obtained at the time of manufacturing the tunable filter. The base band circuit 20 reads this information, and controls the PLL circuits 16 and 18, thereby accurately controlling the oscillation frequencies of the first voltage controlled oscillator 13 and the second voltage controlled oscillator 14.

The center frequency and the bandwidth in the passage characteristics of the ladder filter (i.e., filter main body) 11 are determined by the control voltages V1 and V2 that are output from the voltage applying circuits 17 and 19, respectively. More specifically, as shown in FIG. 8, the center frequency of the filter is determined by the control voltage V2 that is output from the voltage applying circuit 19, and the bandwidth of the filter is determined by the control voltage V1 output from the voltage applying circuit 17.

Figure 9:
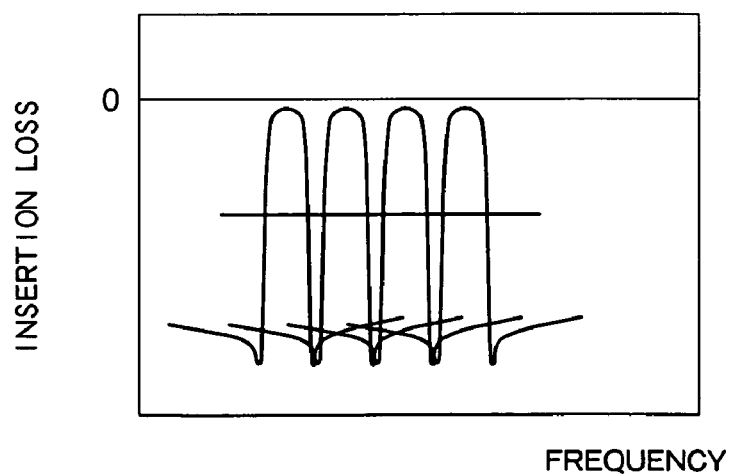
FIG. 9 is a diagram showing passage characteristics of the tunable filter shown in FIG. 1.

FIG. 9 is a diagram showing passage characteristics of the tunable filter shown in FIG. 1. As shown in FIG. 9, when the voltages applied by the voltage applying circuits 17 and 19 are changed within the range of 0 to 3 volts, the center frequency changes within a range of 2.95 MHz to 3.08 MHz, thereby obtaining a large range of a frequency change of 43 percent. At the same time, very precipitous shielding characteristic can be obtained.

As explained above, according to the first embodiment, a feedback control, in which capacitances of the variable capacitors 7 and 9 within the filter main body 11 are controlled in accordance with the oscillation frequencies within the first and the second voltage controlled oscillators 13 and 14 as a monitoring circuit, is performed continuously during communication. With this arrangement, stable filter characteristics can be obtained without being affected by frequency drift due to rise in the temperature of the device.

While the monitoring circuit including the first and the second voltage controlled oscillators 13 and 14 is used in FIG. 1, the configuration of the monitoring circuit is not particularly limited. By using this type of monitoring circuit, capacitances of variable capacitors during operation are accurately measured. Further, a resonance frequency of a resonance circuit combined with an inductor element is accurately monitored. Capacitances are calculated based on a result of monitoring the resonance frequency, and are fed back to the voltage applying circuits 17 and 19 that drive the variable capacitors. As a result, characteristics of the filtering circuit consisting of the variable capacitors 7 and 9 and the film bulk acoustic resonator 8 can be controlled accurately.

(Second Embodiment)

A tunable filter according to a second embodiment is the same as that according to the first embodiment, except the circuit configuration of the filter main body 11 is different. Therefore, the difference is mainly explained hereinafter.

FIG. 10 is a circuit diagram of the filter main body 11 according to the second embodiment. The filter main body 11 shown in FIG. 10 includes two capacitors 71 and 72 that are connected in series, and a parallel resonance unit 75 having two resonance units 73 and 74 connected to between one end of the capacitors 71 and 72, respectively and an input/output common terminal. Each of the resonance units 73 and 74 has the film bulk acoustic resonator 8 and the variable capacitor 7 that are connected in parallel, and the variable capacitor 9 that is connected in series with them, like the resonator shown in FIG. 1. The number of resonators that constitute the parallel resonance unit 6 is not particularly limited to two.

FIG. 11 is a diagram showing passage characteristics of the tunable filter using the filter main body 11 shown in FIG. 10. FIG. 11 shows a change in the passage characteristics when the application voltages output from the voltage applying circuits 17 and 19 shown in FIG. 1 are changed.

As is clear from a comparison between FIG. 1 and FIG. 10, number of elements of the filter main body 11 shown in FIG. 10 is smaller than that of the filter main body shown in FIG. 1. Therefore, the area in which the elements are formed can be reduced, and the passage bandwidth becomes half of that in FIG. 9. Further, when the capacitances of the variable capacitors 7 and 9 are changed, a total change in the impedance of the filter is small. On the other hand, attenuation characteristic becomes milder than that in FIG. 9.

Shielding characteristics in areas other than the passage band are different between at the low-frequency side and at the high-frequency side.

As explained above, according to the second embodiment, the filter main body 11 can be made smaller.

(Third Embodiment)

A tunable filter according to a third embodiment is the same as that according to the first embodiment, except the circuit configuration of the filter main body 11 is different. Therefore, the difference is mainly explained.

FIG. 12 is a circuit diagram of the filter main body 11 according to the third embodiment. The filter main body 11 shown in FIG. 12 has a lattice filter configured by four resonators 76 connected in a bridge. Each resonance unit 76 has the film bulk acoustic resonator 8 and the variable capacitor 7 that are connected in parallel, and the variable capacitor 9 that is connected in series with them, like the resonator shown in FIG. 1.

Among the four resonators 76 shown in FIG. 12, the film bulk acoustic resonators 8 included in the two resonators on one diagonal line and the film bulk acoustic resonators 8 included in the two resonators on the other diagonal line have mutually different thicknesses in their upper electrodes 55. Therefore, resonance frequencies of the resonators on one diagonal line and resonance frequencies of the resonators on the other diagonal line are different from each other by a predetermined level.

FIG. 13 is a diagram showing passage characteristics of the tunable filter using the filter main body 11 shown in FIG. 12. This diagram shows passage characteristics when the voltage applying circuit controls capacitances of the variable capacitors 7 and 9 within a range of control voltage 0 to 3 volts. The center frequency changes within a range of 2.98 MHz to 3.12 MHz, thereby obtaining a large range of a frequency change of 5.2 percent. At the same time, very large out-of-band attenuation characteristics are obtained.

As explained above, when a lattice filter is configured by plural resonators, a large variable-frequency range can be obtained, in a similar manner to that according to the first embodiment.

(Fourth Embodiment)

According to a fourth embodiment, a circuit configuration of the control circuit 12 is different from that according to the first embodiment.

Figure 14:
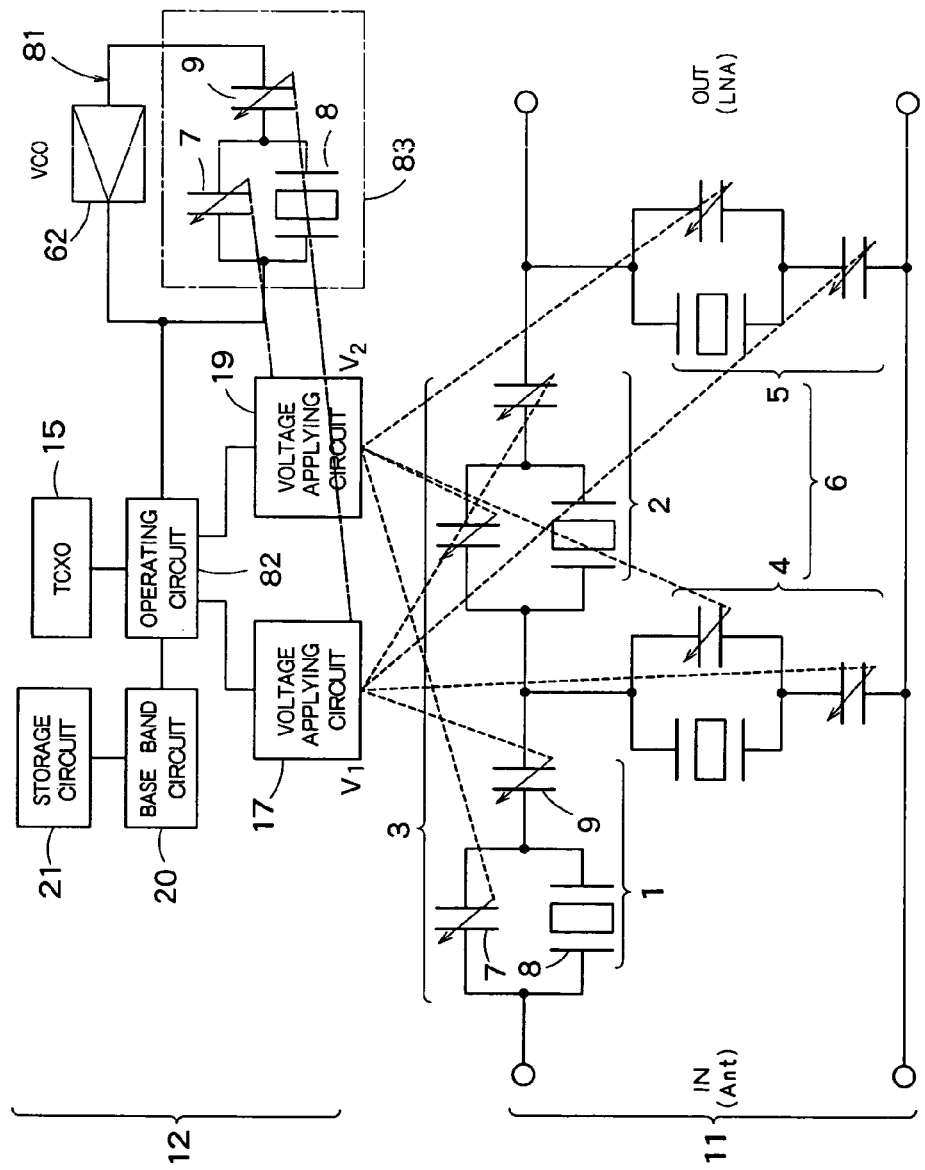
FIG. 14 is an equivalent circuit diagram of a tunable filter according to the fourth embodiment of the present invention.

FIG. 14 is an equivalent circuit diagram of a tunable filter according to the fourth embodiment of the present invention. The tunable filter shown in FIG. 14 has the control circuit 12 having a circuit configuration different from that shown in FIG. 1. The control circuit 12 shown in FIG. 14 has a monitoring circuit 81 that constitutes a voltage controlled oscillator, the temperature compensated crystal oscillator 15, the voltage applying circuits 17 and 19, the base band circuit 20, the storage circuit 21, and an operating circuit 82.

The monitoring circuit 81 has the amplifier 62 and a resonance unit 83 that are connected in parallel. The resonance unit 83 has the film bulk acoustic resonator 8 and the variable capacitor 7 that are connected in parallel, and the variable capacitor 9 that is connected in series with them, like the resonator shown in FIG. 1.

The voltage applying circuit 17 controls capacitance of the variable capacitor 9 within the monitoring circuit 81, capacitance of the variable capacitor 9 within the series resonance unit 3 of the filter main body 11, and capacitance of the variable capacitor 9 within the parallel resonance unit 6. The voltage applying circuit 19 controls capacitance of the variable capacitor 7 within the monitoring circuit 81, capacitance of the variable capacitor 7 within the series resonance unit 3 of the filter main body 11, and capacitance of the variable capacitor 7 within the parallel resonance unit 6.

FIGS. 15A and 15B are diagrams for explaining the principle of the operation of the tunable filter shown in FIG. 14. As shown in FIG. 15A, when the voltage applying circuit 17 controls the control voltage V1 supplied to the monitoring circuit 81, the oscillation frequency of the monitoring circuit 81 changes within a range of Fr to Fa. As shown in FIG. 15B, a center frequency is determined by the control voltage V2 output from the voltage applying circuit 19, and a passage bandwidth is determined by the control voltage V1 output from the voltage applying circuit 17.

The storage circuit 21 stores in advance at a manufacturing time, the oscillation frequency of the monitoring circuit 81 corresponding to the band passage characteristics optimum for selecting a channel individual to a communication system. With this arrangement, the operating circuit 82 can accurately control the oscillation frequency of the monitoring circuit 81 corresponding to the passage characteristics desirable during communications. This feedback control of the oscillation frequency is carried out continuously during communications.

As explained above, according to the fourth embodiment, stable filter characteristics can be obtained without being affected by frequency drift due to rise in the temperature of the device, in a similar manner to that according to the first embodiment.

(Fifth Embodiment)

According to a fifth embodiment, a circuit configuration of the monitoring circuit is different from that according to the fourth embodiment.

FIG. 16 is an equivalent circuit diagram of a tunable filter according to the fifth embodiment of the present invention. The tunable filter shown in FIG. 16 has a monitoring circuit 91 having a circuit configuration different from that of the monitoring circuit 81 shown in FIG. 14. The tunable filter shown in FIG. 16 is input with an oscillation signal of a predetermined frequency from a voltage controlled oscillator 92 provided at the outside.

The monitoring circuit 91 shown in FIG. 16 includes resonators similar to those shown in FIG. 1. Each resonator has the film bulk acoustic resonator 8 and the variable capacitor 7 that are connected in parallel, and the variable capacitor 9 that is connected in series with the film bulk acoustic resonator 8 and the variable capacitor 7.

The voltage applying circuit 17 controls capacitance of the variable capacitor 9 within the monitoring circuit 91, capacitance of the variable capacitor 9 within the series resonance unit 3 of the filter main body 11, and capacitance of the variable capacitor 9 within the parallel resonance unit 6. The voltage applying circuit 19 controls capacitance of the variable capacitor 7 within the monitoring circuit 91, capacitance of the variable capacitor 7 within the series resonance unit 3 of the filter main body 11, and capacitance of the variable capacitor 7 within the parallel resonance unit 6.

Figure 17A:
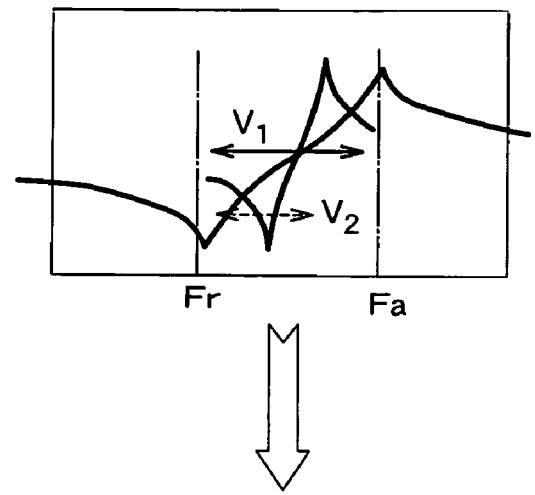
FIGS. 17A and 17B are diagrams for explaining the principle of the operation of the tunable filter shown in FIG. 16.
Figure 17B:
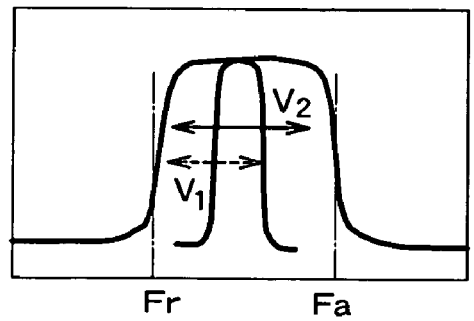

FIGS. 17A and 17B are diagrams for explaining the principle of the operation of the tunable filter shown in FIG. 16. As shown in the diagram, capacitances of the variable capacitors 7 and 9 within the monitoring circuit 91 are controlled based on the control voltage V1 output from the voltage applying circuit 17 and the control voltage V2 output from the voltage applying circuit 19, respectively. As a result, oscillation frequencies change, and the passage bandwidth and the center frequency of the filter main body 11 are controlled. Mainly, as shown in FIG. 17B, the center frequency of the filter main body 11 is controlled based on the control voltage V1, and the bandwidth of the filter main body 11 is controlled based on the control voltage V2.

The voltage applying circuits intermittently control the control voltages V1 and V2 during communications.

As explained above, according to the fifth embodiment, stable filter characteristics can be obtained without being affected by frequency drift due to rise in the temperature of the device, in a similar manner to that according to the first embodiment.

(Sixth Embodiment)

According to a sixth embodiment, the variable capacitors 7 and 9 and the film bulk acoustic resonator 8 of the filter main body 11 are used as a part of the control circuit 12.

FIG. 18 is an equivalent circuit diagram of a tunable filter according to the sixth embodiment of the present invention. The tunable filter shown in FIG. 18 has the control circuit 12 of which circuit configuration is different from that shown in FIG. 1.

The control circuit 12 shown in FIG. 18 has the temperature compensated crystal oscillator 15, a voltage applying circuit 101, the base band circuit 20, the storage circuit 21, the operating circuit 82, switching circuits 102, 103, and 104, a detecting circuit 106 that detects the amplitude of a signal output from the filtering circuit 11, and a temperature detector 107 that detects the ambient temperature. The filter main body 11 has a circuit similar to that shown in FIG. 1. At the time of adjusting filter characteristics, the outside voltage controlled oscillator 92 inputs an oscillation signal having a predetermined frequency to the filter main body 11 via the switching circuit 104.

The switching circuit 103 uses the variable capacitors 7 and 9 of any one of the resonators of the filter main body 11, as a part of the monitoring circuit 81, and is used to control capacitances of these variable capacitors 7 and 9. The variable capacitors 7 and 9 that are not selected by the switching circuit 102 hold charges held when these variable capacitors are connected to the switching circuit 102 before.

The switching circuit 103 is switched at the time of monitoring the variable capacitors 7 and 9 of any one of the resonators of the filter main body 11.

According to the present embodiment, the output from the voltage controlled oscillator is intermittently sweep input to the filter main body 11 via the switching circuit 104 when the power is turned on or during communications. The detecting circuit 106 detects the amplitude of the output signal from the filter main body 11. The operating circuit 82 controls capacitances of the variable capacitors 7 and 9 based on a result of detecting the amplitude by the detecting circuit 106 and a result of detecting the temperature by the temperature detector 107. More specifically, the operating circuit 82 controls capacitances of the variable capacitors 7 and 9 so that the amplitude of the output signal from the filter main body 11 becomes maximum. With this arrangement, stable filter characteristics can be obtained without being affected by frequency drift due to rise in the temperature of the device.

As explained above, according to the sixth embodiment, the filter main body 11 can be used as a monitoring circuit by switching the switching circuits 102 to 104. As a result, an exclusive monitoring circuit is not necessary, thereby simplifying a circuit configuration.

(Seventh Embodiment)

According to a seventh embodiment, a circuit configuration of a monitoring circuit is different from those according to the preceding embodiments.

FIG. 19 is an equivalent circuit diagram of a tunable filter according to the seventh embodiment of the present invention. The tunable filter shown in FIG. 19 includes the voltage applying circuits 17 and 19, the base band circuit 20, the storage circuit 21, monitoring circuits 111 and 112, and a temperature detecting circuit 113.

Each of the monitoring circuits 111 and 112 has a variable capacitor 114 and a capacitance detecting circuit 115 that are connected in parallel. The capacitance detecting circuit 115 measures capacitances of the variable capacitors 7 and 9 that are connected in parallel, and transmits a result of the measuring to the operating circuit 82.

The voltage applying circuit 17 controls capacitance of the variable capacitor 114 within the monitoring circuit 111, capacitance of the variable capacitor 9 within the series resonance unit 3 of the filter main body 11, and capacitance of the variable capacitor 9 within the parallel resonance unit 6. The voltage applying circuit 19 controls capacitance of the variable capacitor 114 within the monitoring circuit 112, capacitance of the variable capacitor 7 within the series resonance unit 3 of the filter main body 11, and capacitance of the variable capacitor 7 within the parallel resonance unit 6.

The operation of the principle of the tunable filter shown in FIG. 19 is explained hereinafter. A resonance frequency Fr' and an antiresonance frequency Fa' of the resonator in the filter main body 11 can be calculated based on the following expressions (1) and (2), using the resonance frequency Fr and the antiresonance frequency Fa of the film bulk acoustic resonator 8, the capacitance VC1 of the variable capacitor 7 connected in parallel, and the capacitance VC2 of the variable capacitor 9 connected in series.

$$f'_R = f_R \sqrt{1 + \frac{C_1}{C_0 + V_{C1} + V_{C2}}} \quad (1)$$

$$f'_A = f_R \sqrt{1 + \frac{C_1}{C_0 + V_{C1}}} \quad (2)$$

Capacitors $C_0$ and $C_1$ correspond to an equivalent capacitance and a parallel equivalent capacitance, respectively when the film bulk acoustic resonator 8 is expressed by a BVD model equivalent circuit.

Therefore, when the resonance frequency and the antiresonance frequency of each resonator in the filter main body 11, and the capacitances of the variable capacitor 7 connected in parallel and the variable capacitor 9 connected in series within each resonator are controlled based on the measured capacitances of the variable capacitors 114 within the monitoring circuits 111 and 112, band passage characteristics of the filtering circuit can be set to a value that is optimum for selecting a channel individual to a communication system.

As explained above, according to the seventh embodiment, configurations of the monitoring circuits 111 and 112 can be simplified. Using a simpler circuit than that according to the first embodiment, stable filter characteristics can be obtained without being affected by frequency drift due to rise in the temperature of the device.

(Eighth Embodiment)

An eighth embodiment is a modified example of the seventh embodiment, and differences from the seventh embodiment will be mainly described hereinafter.

Figure 20:
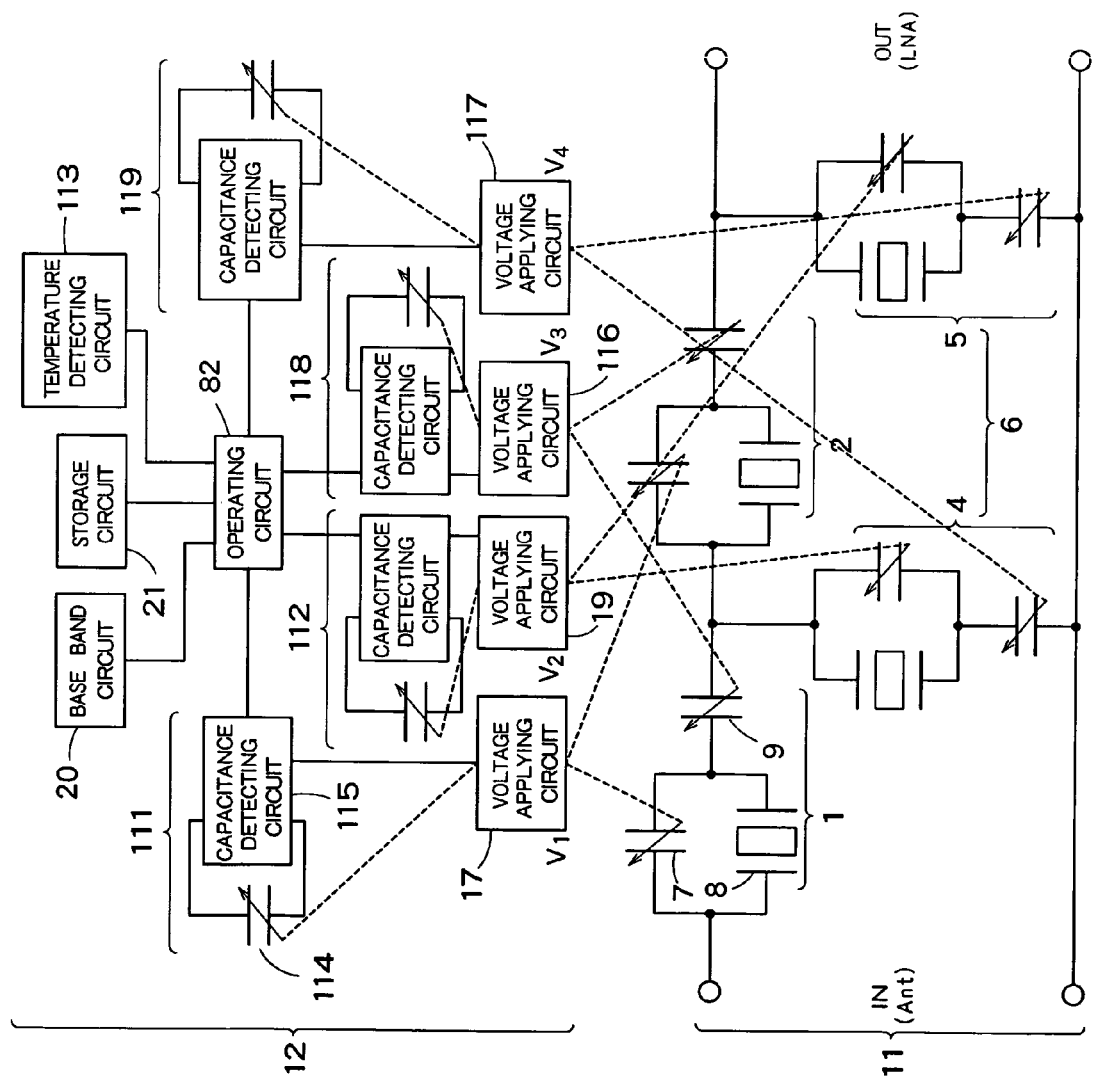
FIG. 20 is an equivalent circuit diagram of a tunable filter according to the eighth embodiment of the present invention.

FIG. 20 is an eqvalent circuit diagram of a tunable filter according to the eighth embodiment of the present invention. The tunable filter of FIG. 20 has voltage applying circuits 116 and 117, and monitor circuits 118 and 119, in addition to the constituents of FIG. 19.

Each of the monitor circuits 118 and 119 has a variable capacitor 114 and a capacitance detecting circuit 115 connected in parallel, similarly to the monitor circuit 111. The capacitance detecting circuit 115 measures the capacitance of the variable capacitor 114 connected in parallel, and transmits the measured result to the operating circuit 82.

The voltage applying circuit 17 controls capacitance of the variable capacitor 114 in the monitor circuit 111 and capacitance of the variable capacitor 9 in the series resonance unit 3 in the filter main body 11. The voltage applying circuit 19 controls capacitance of the variable capacitor 114 in the monitor circuit 112 and capacitance of the variable capacitor 7 in the parallel resonance unit 6 in the filter main body 11. The voltage applying circuit 116 controls capacitance of the variable capacitor 114 in the monitor circuit 118 and capacitance of the variable capacitor 9 in the series resonance unit 3 in the filter main body 11. The voltage applying circuit 117 controls capacitance of the variable capacitor 114 in the monitor circuit 119 and capacitance of the variable capacitor 9 in the parallel resonance unit 6 in the filter main body 11.

According to the eighth embodiment, resonance frequency and antiresonance frequency of the series resonance unit 3 in the filter main body 11, and capacitances of the variable capacitor 7 connected in parallel and the variable capacitor 9 connected in series in the series resonance unit 3 can be controlled based on the measured capacitances of the variable capacitors 114 in the monitor circuits 111 and 112. Resonance frequency and antiresonance frequency of the parallel resonance unit 6, and capacitances of the variable capacitor 7 connected in parallel and the variable capacitor 9 connected in series in the parallel resonance unit 6 can be controlled based on the measured capacitances of the variable capacitors in the monitor circuits 118 and 119.

Therefore, it is possible to control band-pass property of the filter circuit, especially, central pass frequency and band-pass over a range of broad frequency band, and to set the band-pass property to an optimum value for channel selection inherent to the communication system.

As described above, according to the eighth embodiment, it is possible to simplify the configurations of the monitor circuits 111 and 112, and to obtain stable filter property corresponding to the central frequency and the band-pass width at a range broader than that of the first embodiment.

(Nineth Embodiment)

According to the fourth, the fifth, and the seventh embodiments, when the variable capacitors 114 within the monitoring circuits 111 and 112 and the variable capacitors 7 and 9 within the filter main body 11 apply the same voltage to the respective piezoelectric driving actuators, the same capacitance needs to be obtained. Further, the variable capacitors 7 connected in parallel or the variable capacitors 9 connected in series in the resonators within the filter main body 11 need to exhibit the same characteristics and the same responses.

The MEMS elements formed on the same substrate according to the semiconductor process usually obtain the same characteristics within a narrow area of at least the same wafer even when there is a large variance among lots or among wafers. Therefore, the control systems according to the fourth, the fifth, and the seventh embodiments can be employed.

In order to enable the resonators to have the same capacitance by receiving control voltages from the voltage applying circuits, one actuator can be shared as shown in FIG. 21 in place of individually providing actuators to the variable capacitors.

FIG. 21 shows an example of a state that one actuator 121 is used to drive variable capacitor within plural resonators. With this arrangement, a variance of characteristics of individual variable capacitors can be reduced.

Actuators of all variable capacitors to which one voltage applying circuit supplies a control voltage can be set together into one. Actuators of all variable capacitors within the resonators 3 connected in series can be set together into one. Actuators of all variable capacitors within the resonators 6 connected in parallel can be set together into one.

As explained above, according to the ninth embodiment, one actuator is used to control capacitances of plural variable capacitors. Therefore, characteristics of the variable capacitors 7 and 9 can be arranged.

(Other Embodiments)

In the above embodiments, a film bulk acoustic resonator is used for the inductor element. Alternatively, a surface acoustic wave element (i.e., a SAW device) can be used. An inductor including a general waveguide and a coil can be also used.

FIG. 22 is a top plan diagram showing one example of a surface acoustic wave element. FIG. 23 is a cross-sectional diagram of the surface acoustic wave element shown in FIG. 22 cut along a line A—A. As shown in these diagrams, the surface acoustic wave element has a comb electrode 132 and an input/output electrode 133 formed on a piezoelectric monochristalline substrate 131.

A monitoring circuit of the above variable capacitors can have various forms. For example, a voltage controlled oscillator using a film bulk acoustic resonator and a variable capacitor can be used, or a filter module having a film bulk acoustic resonator and a variable capacitor connected in series or in parallel can be used. Alternatively, a tunable filter itself can be used to carry out monitoring during the operation.

A filter main body configured by a variable capacitor and an inductor element has various types such as a ladder type and a lattice type. Many circuit systems can be also applied to the monitoring circuit.

In the above embodiments, a resonator uses the variable capacitor 7 and the film bulk acoustic resonator 8 that are connected in parallel, and the variable capacitor 9 that is connected in series with them. However, the circuit configuration of the resonator is not limited to this. For example, FIG. 24 shows an example of a resonator that is configured by a variable capacitor and a film bulk acoustic resonator that are connected in series, and a variable capacitor that is connected in parallel with them. The resonator shown in FIG. 24 can be used in the filter main body 11, shown in FIG. 1 etc., and in the monitoring circuit 83 shown in FIG. 14.

The tunable filters explained in the above embodiments are used in various electric appliances. Because the tunable filter according to the present invention is formed on the semiconductor substrate, the device can be made small. Therefore, the tunable filter can be applied to various portable devices such as a portable telephone.

FIG. 25 is a block diagram showing one example of a schematic configuration of a portable telephone that incorporates the tunable filter according to the above embodiments. This portable telephone is a direct conversion type. The portable telephone shown in FIG. 25 includes an antenna 141, a directional coupler 142 that switches between a transmission and a reception, a transmitter 143, a receiver 144, and a base band processor 145.

The receiver 144 includes a tunable filter 146 explained above, a low noise amplifier (LNA) 147, a phase demodulator 148 that demodulates the phase of an output signal from the LNA 147, and an A/D converter 149 that A/D converts the phase-modulated signal. The transmitter 143 includes a D/A converter 151 that D/A converts a transmission signal generated by the base band processor, a low-pass filter 152 that extracts only a predetermined frequency component of a signal output from the D/A converter 151, a phase modulator 153 that modulates the phase of an output from the low-pass filter 152, and an amplitude modulator 154 that modulates the amplitude of a phase-modulated signal.

The tunable filter can be connected to a latter stage of the LNA.

What is claimed is:

1. A tunable filter, comprising:
    a plurality of variable capacitors and a plurality of inductor elements, each being formed on a common substrate;
    a filter circuit formed by using at least a portion of said plurality of variable capacitors and a portion of said plurality of inductor elements;
    a monitor circuit formed by using at least a portion of said plurality of variable capacitors and a portion of said plurality of inductor elements;
    a detecting circuit which detects a prescribed circuit constant of said monitor circuit;
    a storage which stores information relating to a reference circuit constant of said monitor circuit; and
    a capacitance control circuit which controls capacitance of said variable capacitors in said monitor circuit and capacitance of said variable capacitors in said filter circuit, based on a result detected by said detecting circuit and information stored in said storage.

2. The tunable filter according to claim 1, wherein said monitor circuit is a voltage controlled oscillator;
    said detecting circuit detects an oscillation frequency of said monitor circuit as the prescribed circuit constant;
    said storage stores information relating to a reference oscillation frequency of said monitor circuit;
    said capacitance control circuit controls capacitance of said variable capacitors in said monitor circuit and capacitance of said variable capacitors in said filter circuit, so that said monitor circuit oscillates with the reference oscillation frequency.

3. The tunable filter according to claim 1, wherein said detecting circuit detects capacitance of said variable capacitors in said monitor circuit as the prescribed circuit constant;
    said storage stores information relating to a reference capacitance of said monitor circuit; and
    said capacitance control circuit controls capacitance of said variable capacitors in said monitor circuit and capacitance of said variable capacitors in said filter circuit, so that said variable capacitors in said monitor circuit becomes a reference capacitance.

4. The tunable filter according to claim 1, further comprising a thin-film piezoelectric actuator which is formed on said substrate, and variably controls capacitance of the corresponding variable capacitor, wherein said capacitance control circuit drives said thin-film piezoelectric actuator based on the result detected by said detecting circuit and the information stored in said storage.

5. The tunable filter according to claim 4, wherein at least a portion of said variable capacitors in said filter circuit and at least a potion of said variable capacitors in said monitor circuit are driven by the same thin-film piezoelectric actuator.

6. The tunable filter according to claim 4, wherein said plurality of variable capacitors in said filter circuit are driven by the same thin-film piezoelectric actuator.

7. The tunable filter according to claim 1, wherein said plurality of inductor elements are thin-film piezoelectric resonators or surface acoustic wave resonators.

8. The tunable filter according to claim 1, wherein said filter circuit includes:
 a series resonator having one or more resonance unit connected in series between an input terminal and an output terminal; and
 a parallel resonator which is connected between at least one of an input part and an output part of said series resonator connected in series and a reference voltage terminal, and has one or more resonance unit,
 wherein said resonance units in said series resonator and said parallel resonator are formed by combining said variable capacitor and said inductor element.

9. The tunable filter according to claim 8, wherein a resonance frequency of said resonance unit in said series resonator and a resonance frequency of said resonance unit in said parallel resonator are different from each other by prescribed amount.

10. The tunable filter according to claim 8, wherein said resonance units in said series resonator and said parallel resonator has a first variable capacitor and an inductor element connected in parallel, and a second variable capacitor connected in series therewith.

11. The tunable filter according to claim 8, wherein said resonance units in said series resonator and said parallel resonator has a first variable capacitor and an inductor element connected in series, and a second variable capacitor connected in parallel therewith.

12. The tunable filter according to claim 1, wherein said monitor circuit has a voltage controlled oscillator including a resonance unit formed by using at least a portion of said plurality of variable capacitors and at least a portion of said plurality of inductor elements;
 said detecting circuit detects an oscillation frequency of said voltage controlled oscillator; and
 said capacitance control circuit includes:
 a first voltage applying part which controls capacitance of a portion of said variable capacitors in said resonance unit based on the result detected by said detecting circuit; and
 a second voltage applying part which controls capacitance of at least another portion of said variable capacitors in said resonance unit based on the result detected by said detecting circuit.

13. The tunable filter according to claim 1, wherein said monitor circuit has first and second voltage controlled oscillators which oscillate with oscillation frequencies different from each other;
 said detecting circuit includes:
 a first detector which detects an oscillation frequency of said first voltage controlled oscillator; and
 a second detector which detects an oscillation frequency of said second voltage controlled oscillator,
 said capacitance control circuit includes:
 a first voltage applying circuit which controls the oscillation frequency of said first voltage controlled oscillator based on a result detected by said first detector, and controls capacitance of said variable capacitors in said filter circuit; and
 a second voltage applying circuit which controls the oscillation frequency of said second voltage controlled oscillator based on a result detected by said second detector, and controls capacitance of said variable capacitors in said filter circuit.

14. The tunable filter according to claim 13, wherein said filter circuit includes:
 a series resonator having one or more resonance unit connected in series between an input terminal and an output terminal; and
 a parallel resonator which is connected between at least one of an input part and an output part of said series resonator connected in series and a reference voltage terminal, and has one or more resonance unit,
 wherein said first and second voltage applying parts controls capacitance of said variable capacitors different from each other in said series resonator and said parallel resonator.

15. The tunable filter according to claim 1, wherein said filter circuit includes:
 a plurality of capacitors connected in series between an input terminal and an output terminal; and
 a plurality of resonance units which are connected between the respective terminals of said plurality of capacitors and a reference voltage terminal, and are formed by combining said variable capacitors and said inductor elements.

16. The tunable filter according to claim 1, wherein said filter circuit is formed by connecting a plurality of resonance units formed by combining said variable capacitors and said inductor elements in bridge form.

17. The tunable filter according to claim 1, wherein at least a portion of said plurality of variable capacitors can be used as said filter circuit and said monitor circuit,
 further comprising a switching circuit which switches whether to use said variable capacitor as said filter circuit or said monitor circuit.

18. The tunable filter according to claim 17, further comprising an oscillator which inputs an oscillation signal with a prescribed frequency to said filter circuit in the case of using said variable capacitor by said switching circuit as said monitor circuit,
 wherein said detecting circuit detects amplitude of a signal passing through said filter circuit when the oscillation signal is inputted to said filter circuit; and
 said capacitance control circuit controls capacitance of at least a portion of said variable capacitors in said filter circuit, so that amplitude detected by said detecting circuit is maximized.

19. The tunable filter according to claim 18, further comprising a temperature detector which detects temperature,
 wherein said capacitance control circuit controls capacitance of at least a portion of said variable capacitors in said filter circuit, taking the result detected by said temperature detector into consideration.

20. A portable telephone, comprising:
 an antenna which sends and receives a wireless signal modulated by phase;

a receiver which receives a reception signal received by said antenna; and
a transmitter which sends a transmission signal sent by said antenna,
wherein said receiver includes:
a high frequency amplifier which amplifies the reception signal modulated by phase; and
a tunable filter which is provided at former stage or subsequent stage of said high frequency amplifier and extracts the reception signal in a prescribed frequency component,
said tunable filter having:
a plurality of variable capacitors and a plurality of inductor elements, each being formed on the same substrate;
a filter circuit formed by using at least a portion of said plurality of variable capacitors and a portion of said plurality of inductor elements;
a monitor circuit formed by using at least a portion of said plurality of variable capacitors and a portion of said plurality of inductor elements;
a detecting circuit which detects a prescribed circuit constant of said monitor circuit;
a storage which stores information relating to a reference circuit constant of said monitor circuit; and
a capacitance control circuit which controls capacitance of said variable capacitors in said monitor circuit and capacitance of said variable capacitors in said filter circuit, based on a result detected by said detecting circuit and information stored in said storage.

* * * * *